(12) United States Patent
Baiocco et al.

(10) Patent No.: US 9,093,495 B2
(45) Date of Patent: Jul. 28, 2015

(54) METHOD AND STRUCTURE TO REDUCE FET THRESHOLD VOLTAGE SHIFT DUE TO OXYGEN DIFFUSION

(75) Inventors: Christopher Vincent Baiocco, Newburgh, NY (US); Michael P. Chudzik, Danbury, CT (US); Deleep R. Nair, Fishkill, NY (US); Jay M. Shah, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 447 days.

(21) Appl. No.: 13/342,674

(22) Filed: Jan. 3, 2012

(65) Prior Publication Data

US 2013/0168780 A1 Jul. 4, 2013

(51) Int. Cl.
*H01L 21/02* (2006.01)
*H01L 21/762* (2006.01)
*H01L 29/66* (2006.01)
*H01L 29/78* (2006.01)

(52) U.S. Cl.
CPC ........ *H01L 21/76224* (2013.01); *H01L 21/762* (2013.01); *H01L 29/66537* (2013.01); *H01L 29/783* (2013.01)

(58) Field of Classification Search
CPC ................... H01L 29/66537; H01L 29/66606; H01L 29/783
USPC ........................... 257/410, E29.242, E21.546
See application file for complete search history.

(56) References Cited

U.S. PATENT DOCUMENTS

| | | | |
|---|---|---|---|
| 6,294,807 B1 | 9/2001 | Chittipeddi et al. | |
| 6,475,865 B1 | 11/2002 | Yang et al. | |
| 7,226,831 B1 | 6/2007 | Metz et al. | |
| 7,682,917 B2 | 3/2010 | Bedell et al. | |
| 7,709,317 B2 | 5/2010 | Yang et al. | |
| 7,732,331 B2 | 6/2010 | Kim et al. | |
| 7,898,006 B2 | 3/2011 | Gruening-von Schwerin | |
| 7,989,902 B2 | 8/2011 | Ando et al. | |
| 2002/0160581 A1* | 10/2002 | Watanabe et al. ............. | 438/430 |
| 2010/0102373 A1* | 4/2010 | Li et al. ......................... | 257/301 |
| 2010/0320547 A1* | 12/2010 | Ando et al. .................... | 257/411 |

* cited by examiner

*Primary Examiner* — Elias M Ullah
(74) *Attorney, Agent, or Firm* — Whitham Curtis Christofferson & Cook, PC; Joseph P. Abate

(57) ABSTRACT

Oxygen scavenging material embedded in an isolation structure provides improved protection of high dielectric constant (Hi-K) materials from oxygen contamination while avoiding alteration of work function and switching threshold shift in transistors including such Hi-K materials.

18 Claims, 2 Drawing Sheets

METHOD AND STRUCTURE TO REDUCE FET THRESHOLD VOLTAGE SHIFT DUE TO OXYGEN DIFFUSION

FIELD OF THE INVENTION

The present invention generally relates to integrated circuits including field effect transistors and, more particularly, to avoiding contamination of high dielectric constant (Hi-K) gate insulator structures therein.

BACKGROUND OF THE INVENTION

Demand for increased functionality and performance of integrated circuits has driven designs to extremely high integration density of electronic elements therein that are scaled to extremely small feature sizes. High integration density allows more electronic elements to be provided on a semiconductor chip of a given size while small size and close proximity of those electronic elements reduces signal propagation time, allowing higher clock speeds, and noise susceptibility. Many sophisticated structures have been designed and exotic materials employed to maintain adequate electrical operating margins for transistors and field effect transistors, in particular, as transistors have been scaled to such extremely small sizes.

Among such sophisticated designs and exotic materials is the use of high dielectric constant (Hi-K) materials that have a dielectric constant of eight or greater for extremely thin gate insulators in field effect transistors. Such structures allow the geometry of the electric field and carrier concentration profiles within the conduction channel of such transistors to be controlled more accurately in order to maintain a useable ratio of resistance between "on" and "off" states of the transistors, often referred to simply as the on/off ratio. However, such materials have a high sensitivity to contamination, particularly by oxygen.

Contamination of Hi-K materials by oxygen is particularly problematic since oxygen contamination, in which oxygen diffuses into vacancies in the Hi-K material, alters the work function of the gate and causes a shift in the switching threshold of the transistor. Switching thresholds are, in turn, highly critical in integrated circuits, particularly at high switching speeds and low operating voltages, to insure that transistors change states at substantially the same instant throughout the integrated circuit. Unfortunately, many commonly required structures in integrated circuits, such as insulators or isolation structures are formed of oxides or otherwise provide a source of oxygen that can contaminate Hi-K materials during manufacture and/or operation due to thermal diffusion. Of particular concern is the fact that thermal diffusion of oxygen can continue after an integrated circuit is placed in service and degrade performance beyond specifications that were originally met.

SUMMARY OF THE INVENTION

It is therefore an object of the present invention to provide a method and structure that reduces or avoids contamination of Hi-K dielectric materials by diffused oxygen in integrated circuits.

It is another object of the present invention to provide high-performance, aggressively scaled field effect transistors in integrated circuits that do not exhibit significant shift in threshold voltage.

It is a further object of the invention to provide a structure and method for providing a sink for diffused oxygen capable of depleting unbound oxygen for a substantial distance within an integrated circuit chip and which is present throughout processes for forming electronic elements of an integrated circuit while requiring no additional area of an integrated circuit chip.

In order to accomplish these and other objects of the invention, an integrated circuit is provided including a transistor having a gate stack including a Hi-K material, and an isolation structure including a body of oxygen scavenging material embedded therein.

In accordance with another aspect of the invention, a method of forming an isolation structure in a semiconductor device is provided comprising steps of forming a trench in a body of semiconductor material, applying a liner layer of insulating material in the trench, forming a layer of oxygen scavenging material within the liner layer, applying a layer of insulating material over the layer of oxygen scavenging material to encapsulate said oxygen scavenging material in combination with said liner layer, and annealing the structure resulting from the forming and applying steps.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
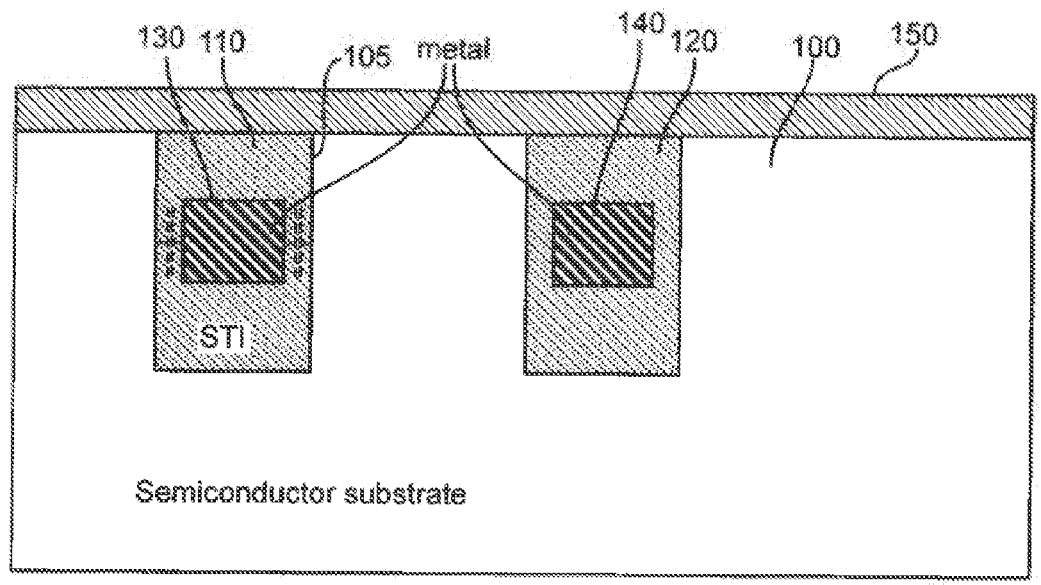
FIG. 1 is a cross-sectional view of a first exemplary embodiment of the invention.

Referring now to the drawings, and more particularly to FIG. 1, there is shown in a cross-sectional view of a representative portion of a semiconductor substrate 100 including a first exemplary embodiment of the invention. As will be recognized by those skilled in the art of semiconductor integrated circuit manufacture, the structure illustrated in cross-section in FIG. 1 represents a very early stage in the manufacture of a given integrated circuit design since the only structures produced on the substrate are shallow trench isolation (STI) structures 110 and 120 for electrical and physical separation of electronic elements such as transistors which will be formed between them during a so-called front end of line (FEOL) stage of manufacture. Therefore, the position, pattern and density of formation of such STI structures will essentially outline the areas where such active and other devices will be formed on the chip.

It also follows that the pattern and density of such isolation structures will vary across the chip area of an integrated circuit of a given design where circuits of differing functionalities are provided on a single chip, as is almost invariably the case. For example, memory chips will comprise a so-called array area which will be populated predominantly by memory cells and transistors for providing low current conduction paths to particular memory cells and a so-called support area which will include logic for converting an address into selection signals for addressing particular memory cells, driver circuits for applying write currents to memory cells and sense amplifiers for detecting the logic state of a given memory cell and outputting a logic level signal in response to the detection; all of which are relatively high current circuits and generally include transistors of somewhat larger size and current carrying capability than transistors in the array area.

It should also be understood that alteration of work function of transistor gates by oxygen contamination of Hi-K dielectric materials used as the gate dielectric of field effect transistors and the threshold shift resulting therefrom are well-known in the semiconductor manufacturing art. A partial solution to the problem is disclosed in U.S. Pat. No. 7,989,902 (assigned to the assignee of the present invention and hereby fully incorporated by reference) which proposes inclusion of oxygen scavenging metal as a layer in the gate structure of transistors which may include, in addition to the Hi-K dielectric layer, an oxide layer, one or more metal layers (of metals that may be chosen and located to achieve a desired work function and switching threshold) and one or more doped and/or undoped polycrystalline semiconductor layers. These layers are sometimes collectively referred to as a gate stack. The oxygen scavenging material, being located more or less closely to the Hi-K material thus absorbs and captures dissolved oxygen in the gate stack structure as it is diffused through the transistor during heat treatment in the manufacturing process and high temperature operation after the integrated circuit is placed in service and provides substantial protection of the Hi-K material from contamination by oxygen.

However, such a gate stack structure presents an increased degree of process complexity and criticality for manufacture and potentially may complicate design since oxygen scavenging metals can also affect the work function and switching threshold of transistors. Nevertheless, such a structure was found to be generally effective in reducing oxygen contamination of Hi-K materials and shifts in switching threshold voltages.

Additionally, it has been recently discovered that some layout-dependent variation in degree of oxygen contamination and threshold voltage shift is being exhibited by integrated circuit designs even using gate stack structures including an oxygen scavenging material such as those that have been discussed above. Even if such variation or shift in threshold voltage is held to a relatively low level it is important and potentially critical to integrated circuit performance.

To understand this potential criticality, it should be appreciated that, due to finite resistance and capacitance of conductors connecting the electronic elements of an integrated circuit and the gate capacitance of field effect transistors, the change of voltage level between logic states, although very rapid, cannot be instantaneous. Thus, if the same rising or falling waveform is applied to two transistors having different switching thresholds, the transistors will switch (generally defined as the time the rising or falling voltage reaches a particular voltage between the voltages representing different logic states) at different instants. This difference in switching times may be multiplied when transistors are connected in logical series (e.g. where the output of one transistor is connected to the gate of another transistor) by the signal propagation time in the connection between the transistors as well as the increase or decrease in time for the voltage to reach the switching threshold of each transistor so connected in logical series. On the other hand, if the two transistors are connected in electrical series and switch at different times, they may form a low resistance connection for a short period of time that increases power consumption by the integrated circuit and generation of excess heat or the node between them (and connecting the transistors in series) may be effectively floating for a portion of the switching time, increasing noise susceptibility.

The criticality in this problem results from the fact that high clock speed and short switching cycles are highly desirable to the point that clock cycle times are desirably held to a small multiple of the period required for the voltage to change between logic voltage levels, sometimes referred to as a slew time. Therefore, a small change in the timing of the switching instant of a transistor multiplied a small number of times by connection of transistors in logical series (which is most likely to be done between transistors in close proximity and thus likely to have similarly shifted switching thresholds) can cause a loss of synchronism across and/or between various functional areas of an integrated circuit chip and, potentially, logic errors when the shift in timing of switching instants approaches a significant fraction of the short clock cycle time.

This problem has proven intractable prior to the present invention and no prior proposed solution has proven effective or practical. For example, providing a large protective spacer between an STI structure and a structure susceptible to oxygen contamination is not practical since it is not scalable in accordance with foreseeable technologies and suitable chip space for such a large structure is not available consistent with providing adequate space for extension implant regions and source/drain diffusions in nodes of aggressively scaled transistors. Integration schemes such as replacement metal gate (RMG) do not address the possible source(s) of diffused oxygen. Attempts to directly reduce concentrations of dissolved oxygen in structures including oxides such as high density plasma deposited silicon film (HDP) are not well suited to forming structures at dense pitches corresponding to aggressively scaled transistors.

The inventors have discovered that layout dependent shifts in switching threshold which have been recently observed may be due to structures containing oxides, such as silicon oxide ($SiO_2$) which are also likely to contain significant amounts of dissolved oxygen not adequately bound in the oxide. That is, observed switching threshold shifts differ from location to location across an integrated circuit chip in a manner that appears to exhibit a dependency on proximity to other structures including an oxide region and isolation structures, in particular. Thus, since STI structures and other types of isolation structures may typically be formed of oxides and are of substantial volume while the volume and density of formation of such structures can be expected to vary between different functional areas of an integrated circuit chip, as alluded to above, such isolation structures may be a significant diffusion source for oxygen capable of contaminating Hi-K materials; the effects and observability of which varies from location to location on the integrated circuit chip.

Returning now to FIG. 1, the invention, in accordance with its most basic principles provides a sink for diffused oxygen at a probable source thereof by incorporating an oxygen scavenging material into isolation structures such as STI structures to scavenge and bind dissolved oxygen contained in oxides at its source. (As used herein, the term "scavenge", "scavenging" or other grammatical forms of either term should be understood as a collective reference to all types of mechanisms, including gettering, that provide a diffusion sink for a particular type of material species.) Such a solution is highly counterintuitive since materials that are most suitable for oxygen scavenging are metals or alloys or nitrides of metals or metal alloys, (one or more of which can be used in mixtures or combinations in layered structures or one or more separate bodies) such as titanium, titanium nitride, titanium aluminum nitride, tantalum, tantalum nitride and tantalum aluminum nitride.

Such materials generally exhibit a significant degree of electrical conductivity and would thus appear inappropriate for inclusion in an isolation structure. However, as will be apparent from FIG. 1 or 2, the path across an STI structure having a conductive body embedded therein appears as a pair of series connected capacitors (shown in dashed lines) or capacitive voltage divider and thus serves to reduce the voltage across the dielectric material in the isolation structure. Therefore only a sufficient thickness of dielectric material surrounding the scavenging material sufficient to avoid breakdown at approximately one-half the operating voltage need be provided.

More specifically, as shown in FIG. 1, a semiconductor substrate 100 has a plurality of trenches 105 formed therein which are lined with dielectric material 110, 120 to form an STI structure. Bodies of oxygen scavenging material 130, 140 which may be mixtures, layered structures or the like of oxygen scavenging materials such as those alluded to above which are collectively illustrated by a horizontal dashed line 90 in FIG. 4) are embedded in the dielectric material 110, 120 which may form respective source for oxygen that may diffuse throughout structures that may be subsequently formed on or in semiconductor substrate 100. Different oxygen scavenging materials or mixtures, combinations or layers thereof can also be used in respective isolation structures.

Figure 2:
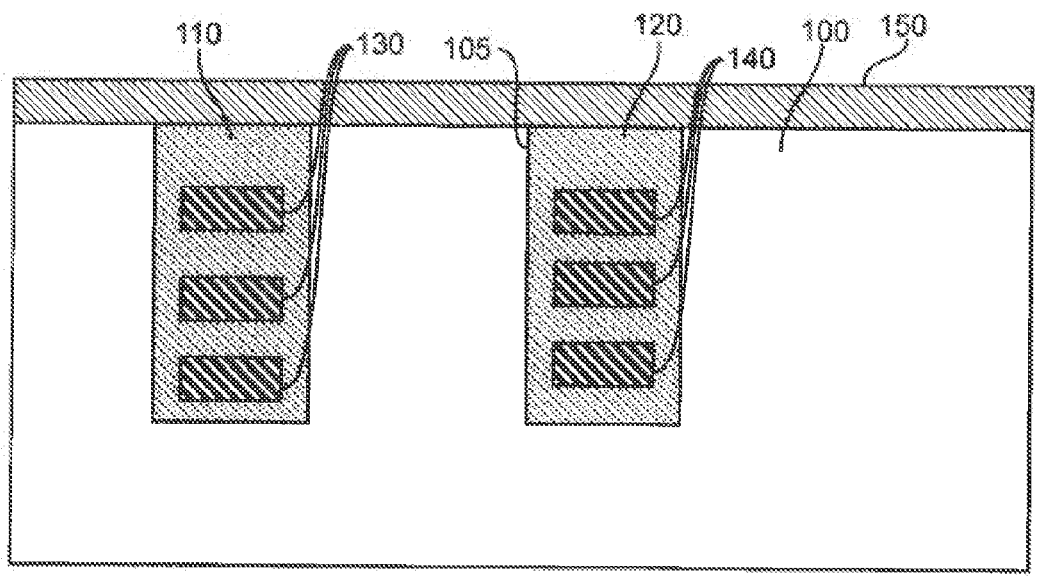
FIG. 2 is a cross-sectional view of a second exemplary embodiment of the invention.

A further layer 150 is illustrated in FIGS. 1 and 2 which does not form part of the isolation structure in accordance with the invention but is intended to represent a blanket layer of Hi-K dielectric material that will be applied and patterned far later in the manufacturing process for the integrated circuit. Hi-K layer 150 is illustrated here to show that, when formed as a blanket layer, it is in contact with the STI structures which may be a source of contamination. Even though portions of Hi-K layer 150 overlying the STI structures will be etched away when the layer is patterned to form transistor gates or the like, contaminating oxygen can possibly diffuse through the Hi-K material to portions of layer 150 that will remain (e.g. as the gate dielectric layer of a transistor) after patterning of layer 150. On the other hand, many integrated circuit designs form transistor gates from an extended conductor that crosses the transistor channel regions. In such a design, the Hi-K material as well as the conductor will also cross the isolation structure and be in contact with the oxygen contamination source even after the gate stacks, including the Hi-K material, is patterned and thus provides a diffusion path for contaminating oxygen even in the completed integrated circuit. The same is true for a gate stack structure that simply extends beyond the active channel area of the transistor and overlaps the isolation structure to some degree. In either case, the greater the overlap the greater the problem and likely severity of oxygen contamination. As alluded to above, in severe cases where the oxygen contamination reaches the gate metal, the contamination can further change the work function and switching threshold voltage of the transistor or, if the contaminating oxygen diffuses into the semiconductor material of the channel, it will generally form an oxide (e.g. $SiO_2$, generally referred to as regrowth) that increases the effective thickness of the gate dielectric; defeating the purpose of the Hi-K material, decreasing capacitance and reducing transistor performance. However, the presence of oxygen scavenging material within the STI structure will reduce or eliminate diffusion of oxygen from the isolation structure dielectric 110, 120 to layer 150 even where those structures are in contact with each other; making overlap of the Hi-K material and the isolation structure substantially irrelevant to transistor design and integrated circuit layout and providing increased freedom of integrated circuit design.

This embodiment of the invention is preferred for process simplicity for fabricating an STI structure with an oxygen scavenging structure embedded therein. The dimensions of the oxygen scavenging structure and surrounding dielectric insulator material are not critical as long as a sufficient thickness of dielectric insulator material surrounds it to avoid breakdown at the low voltages likely to be imposed thereon, as alluded to above.

FIG. 2 illustrates an exemplary alternative embodiment of the invention that is preferred for high oxygen scavenging performance. FIG. 2 differs from FIG. 1 in that a plurality of oxygen scavenging structures 130, 140 are provided in each STI structure. This alternative embodiment of the invention provides greater surface area of the oxygen scavenging structures in contact with the dielectric material that appears to be an oxygen source that may cause layout dependent Hi-K material contamination and switching threshold shift in transistors formed between the STI structures. This alternative embodiment may also provide an improvement in scavenging when the isolation structures extend to a greater depth within the semiconductor substrate.

The isolation structure in accordance with the invention can be formed by any of a number of methods which will be apparent to those skilled in the art. It should be appreciated that substantial flexibility is provided in choice of process since no electronic elements have yet been formed on or in semiconductor substrate 100 and thus the thermal budget for forming the isolation structures is essentially unlimited. By the same token, it should be appreciated that forming the isolation structures in accordance with the invention prior to any other structure provides oxygen scavenging structures in place which can scavenge oxygen during the thermal budget of the formation of electronic elements and assures that little, if any, oxygen is available which might contaminate such structures during their formation.

Figure 3:
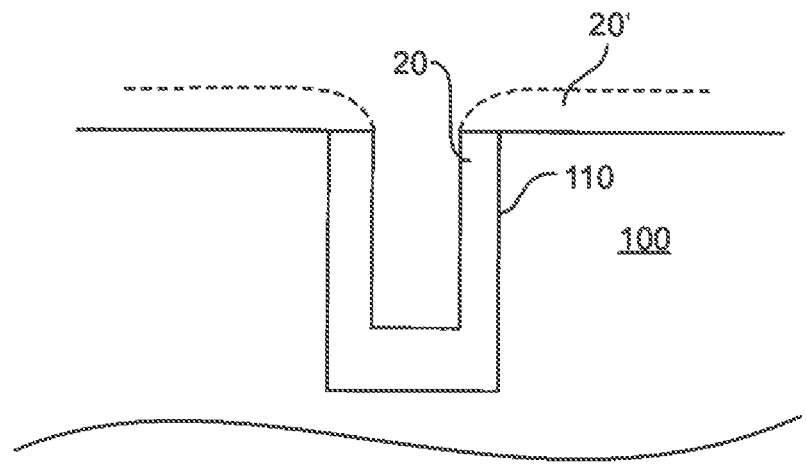
FIGS. 3, 4 and 5 are a sequence of cross-sectional views illustrating an exemplary manufacturing process for the invention.

As shown in FIG. 3, the process begins with a semiconductor substrate 100 having trenches 110 formed therein. The formation of an isolation structure (e.g. STI) begins with a conformal (e.g. anisotropic) deposition of dielectric material 20, 20'. The dielectric material on the surface of the semiconductor substrate can be and preferably is removed by chemical mechanical polishing (CMP) to achieve planarization. This process forms a liner 20 within the trench of a sufficient thickness to avoid breakdown at voltages likely to be applied thereto, generally about one-half of the operating voltage of the integrated circuit, as alluded to above.

Figure 4:
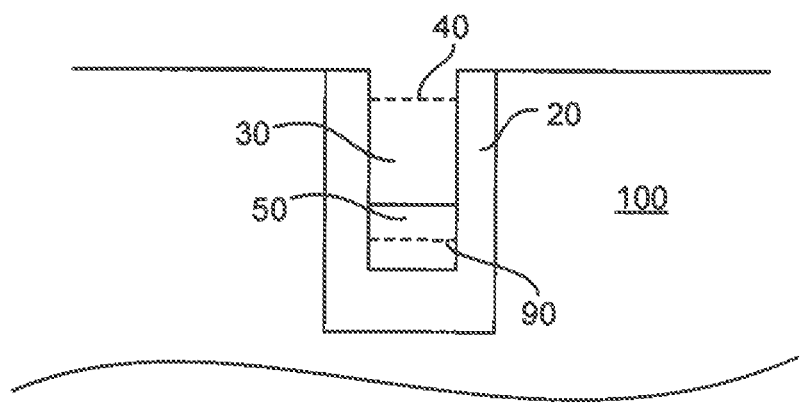
Figure 5:
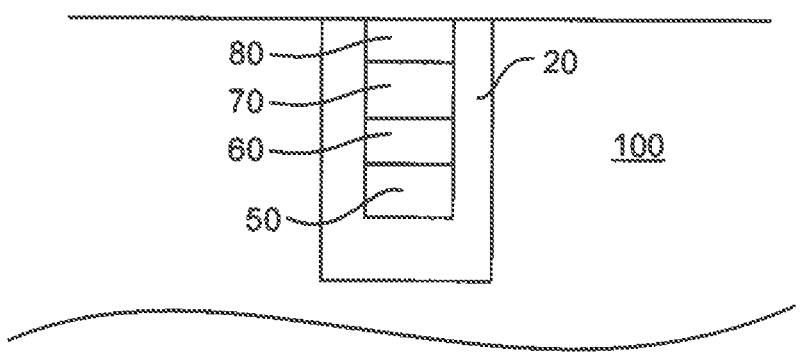

The formation of liner 20 is followed by a preferably selective or isotropic deposition of an oxygen scavenging material to a desired depth (e.g. as shown by dashed line 40) within liner 20. The oxygen scavenging material may then be selectively etched back to a desired thickness, particularly if the structure of the alternative embodiment of FIG. 2 is to be formed; removing material from volume 30 but leaving volume 50 in place, as illustrated in FIG. 4.

Then, if the alternative embodiment of FIG. 2 is to be formed, another layer of dielectric material 60 is deposited, followed by another layer of oxygen scavenging material 70. Formation of these two layers 60, 70 can be repeated, as may be desired to form additional oxygen scavenging structures embedded within the isolation structure. Finally, in either embodiment, a capping layer of dielectric 80 is formed to complete the embedding of the oxygen scavenging material.

The structure is then preferably planarized to the surface of the semiconductor substrate 100 and annealed in an inert atmosphere. The annealing process will cause diffusion of any unbound oxygen in the isolation structure or elsewhere in the semiconductor substrate 100 to diffuse to and into the oxygen scavenging structures 130, 140 since diffusion proceeds in a direction that tends to make concentration of the diffusing species uniform throughout the structure. Since oxygen reaching the scavenging structures is bound thereto or therein, the concentration of oxygen at the surface thereof is depleted during annealing and diffusion and becomes minimal. Thus diffusion will be preferentially in the direction of the oxygen scavenging structures over a substantial distance. Therefore, very little if any unbound oxygen will remain in the structure to potentially contaminate any Hi-K material (e.g. layer 150) later applied during formation of electronic elements of the integrated circuit while any unbound oxygen becoming available later will be largely scavenged during the heat treatment and process temperatures incident to forming the electronic elements; providing excellent protection from oxygen contamination throughout the manufacturing process for the integrated circuit.

In view of the foregoing, it is clearly seen that formation of oxygen scavenging structures embedded within isolation structures such as STI structures removes oxygen that could potentially contaminate Hi-K materials at the probable principal source thereof and prior to the application of any Hi-K material or other material similarly subject to oxygen contamination. This protection provided by the invention remains in place during all subsequent processes for integrated circuit formation and periods of high temperature operation after the integrated circuit is placed in service. Further, the placement of oxygen scavenging materials within isolation structures avoids complication of design or fabrication of the electronic elements of the integrated circuit such as the gate stacks of transistors. The invention is also completely compatible with use of oxygen scavenging materials in other locations in integrated circuit structures for enhanced protection of Hi-K and other materials susceptible to oxygen contamination.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. An integrated circuit including
   areas for electronic elements which include a high dielectric constant (Hi-K) material such as a transistor having a gate stack including a Hi-K material, and
   an isolation structure electrically and physically separating said areas for electronic elements, said isolation structure including a volume of insulating material having a body of oxygen scavenging material embedded therein and fully surrounded by and electrically isolated by said insulating material.

2. The integrated circuit as recited in claim 1, including two or more bodies of oxygen scavenging materials.

3. The integrated circuit as recited in claim 2, wherein said two or more bodies of oxygen scavenging material comprise metals or alloys or nitrides of metals or alloys of metals.

4. The integrated circuit as recited in claim 3, wherein at least one of said bodies of oxygen scavenging material includes one or more materials selected from the group consisting of titanium, titanium nitride, titanium aluminum nitride, tantalum, tantalum nitride and tantalum aluminum nitride.

5. The integrated circuit as recited in claim 4, wherein said one or more bodies of oxygen scavenging materials are layered structures comprising layers of oxygen scavenging material.

6. The integrated circuit as recited in claim 3, wherein said one or more bodies of oxygen scavenging materials are layered structures comprising layers of oxygen scavenging material.

7. The integrated circuit as recited in claim 2, wherein said isolation structure is a shallow trench isolation structure.

8. The integrated circuit as recited in claim 2, wherein said one or more bodies of oxygen scavenging materials are layered structures comprising layers of oxygen scavenging material.

9. The integrated circuit as recited in claim 1, wherein said body of oxygen scavenging material comprises metals or alloys or nitrides of metals or alloys of metals.

10. The integrated circuit as recited in claim 9, wherein said body of oxygen scavenging material includes one or more materials selected from the group consisting of titanium, titanium nitride, titanium aluminum nitride, tantalum, tantalum nitride and tantalum aluminum nitride.

11. The integrated circuit as recited in claim 10, wherein said one or more bodies of oxygen scavenging materials are layered structures comprising layers of oxygen scavenging material.

12. The integrated circuit as recited in claim 9, wherein said body of oxygen scavenging materials are layered structures comprising layers of oxygen scavenging material.

13. The integrated circuit as recited in claim 9, wherein said isolation structure is a shallow trench isolation structure.

14. The integrated circuit as recited in claim 1, wherein said body of oxygen scavenging material comprises metals or alloys or nitrides of metals or alloys of metals.

15. The integrated circuit as recited in claim 14, wherein said body of oxygen scavenging material includes one or more materials selected from the group consisting of titanium, titanium nitride, titanium aluminum nitride, tantalum, tantalum nitride and tantalum aluminum nitride.

16. The integrated circuit as recited in claim 15, wherein said body of oxygen scavenging material is a layered structure comprising layers of oxygen scavenging material.

17. The integrated circuit as recited in claim 14, wherein said body of oxygen scavenging materials are layered structures comprising layers of oxygen scavenging material.

18. The integrated circuit as recited in claim 14, wherein said isolation structure is a shallow trench isolation structure.

* * * * *